United States Patent [19]
Araki

[11] Patent Number: 5,209,120
[45] Date of Patent: May 11, 1993

[54] SEMICONDUCTOR PRESSURE-DETECTING APPARATUS

[75] Inventor: Toru Araki, Itami, Japan

[73] Assignee: Mitsubishi Denki Kabushiki Kaisha, Tokyo, Japan

[21] Appl. No.: 769,781

[22] Filed: Oct. 2, 1991

[30] Foreign Application Priority Data

Jan. 24, 1991 [JP] Japan .................................. 3-22714

[51] Int. Cl.$^5$ .......................... G01L 7/08; G01L 9/06
[52] U.S. Cl. ................... 73/727; 29/621.1; 73/706; 73/721; 128/675; 338/4
[58] Field of Search .............. 73/727, 726, 720, 721, 73/754, DIG. 4, 706; 338/4, 42; 29/621.1; 128/673, 675

[56] References Cited

U.S. PATENT DOCUMENTS

| 4,691,575 | 9/1987 | Sonderegger et al. | 73/718 |
| 4,823,605 | 4/1989 | Stein | 73/727 |
| 4,838,089 | 6/1989 | Okada et al. | 73/721 |

Primary Examiner—Donald O. Wood
Attorney, Agent, or Firm—Leydig, Voit & Mayer

[57] ABSTRACT

A semiconductor pressure-detecting apparatus includes a semiconductor chip having a diaphragm and a frame molded within a resin with the diaphragm exposed. A reference pressure chamber may be provided between the diaphragm and the frame. Since the diaphragm is exposed, a medium, the pressure of which is to be measured, easily contacts the diaphragm. Therefore, if the stem is connected to a case containing the medium, a high pressure can be measured.

5 Claims, 2 Drawing Sheets

SEMICONDUCTOR PRESSURE-DETECTING APPARATUS

BACKGROUND OF THE INVENTION

1. Field of the Invention

The present invention relates to a semiconductor pressure-detecting apparatus and, more particularly, to a semiconductor pressure-detecting apparatus for measuring the pressure of a high pressure medium and having a reduced size and cost.

2. Description of the Related Art

FIG. 3 is a cross sectional view which illustrates a conventional semiconductor pressure-detecting apparatus, for example, a pressure sensor. Referring to the drawing, a semiconductor chip 5 has, on the surface thereof, a diaphragm 3 for converting the pressure of oil or the like into stress, the oil or the like being a medium (pressure medium) the pressure of which must be measured. Furthermore, the semiconductor chip 5 has a strain gauge 4 for converting the stress of the diaphragm 3 into an electric signal. The semiconductor chip 5 is placed on a frame 7 for absorbing external stress applied to the semiconductor chip 5, the frame 7 being supported by a metal stem 8. The electric signal converted from the stress of the diaphragm 3 by the strain gauge 4 is taken by a lead 9 via a wire 10 electrically connected to the semiconductor chip 5. The above-described lead 9 is hermetically secured to the stem 8 by glass 11. The semiconductor chip 5 is covered with a cap 13 coupled to the stem 8 so that a reference pressure chamber 6, for example, vacuum, is formed. A case 2 in which the medium 1 to be measured is enclosed is connected to a pipe 14 disposed at the central portion of the stem 8.

The conventional semiconductor pressure-detecting apparatus is constituted as described above so that the pressure of the medium 1 to be measured is applied to the diaphragm 3 via the pipe 14. The diaphragm 3 is distorted in accordance with the difference between the pressure of the medium 1 to be measured and that of the reference pressure chamber 6 so that a resistance change takes place in the strain gauge 4. The resistance change can be converted to a voltage change by means of a structure, for example, four strain gauges 4 connected in a Wheatstone bridge circuit. The voltage applied to the strain gauge 4 or the voltage change due to the resistance change in the strain gauge 4 is given from outside or taken via the wire 10 and the lead 9.

In a case where the medium 1 to be measured is a liquid such as oil, a semiconductor pressure-detecting apparatus of the type described above encounters a problem in that the liquid medium cannot be enclosed adjacent to, i.e., immediately below the diaphragm 3. Furthermore, a pipe 14 must be provided for the stem 8 for the purpose of introducing the medium 1 to be measured. What is even worse, a substrate or the like must be provided for the purpose of supporting the lead 9 since the lead 9 for transferring the electric signal is disposed on the same side on which the pipe 14 and the stem 8 are positioned. In consequence, the size of the apparatus cannot be reduced. Furthermore, if the medium 1 to be measured has a high pressure, the pipe 14 must be welded to the case 2, a very difficult task.

SUMMARY OF THE INVENTION

Accordingly, an object of the present invention to provide a semiconductor pressure-detecting apparatus in which a medium, the pressure of which is to be measured, can be easily enclosed and welding to the case can be easily performed and which has a reduced size.

According to an aspect of the present invention, there is provided a semiconductor pressure-detecting apparatus comprising: a semiconductor chip including a diaphragm and a strain gauge; a frame supporting the semiconductor chip; a stem supporting the frame; a wire connected to the semiconductor chip; a lead connected to the wire and penetrating the stem; and a molded portion disposed on a first side of the stem covering the wire, the lead above the stem, the frame, and the semiconductor chip with the diaphragm exposed to the medium, the pressure of which is to be measured.

DESCRIPTION OF THE PREFERRED EMBODIMENTS

Figure 1:
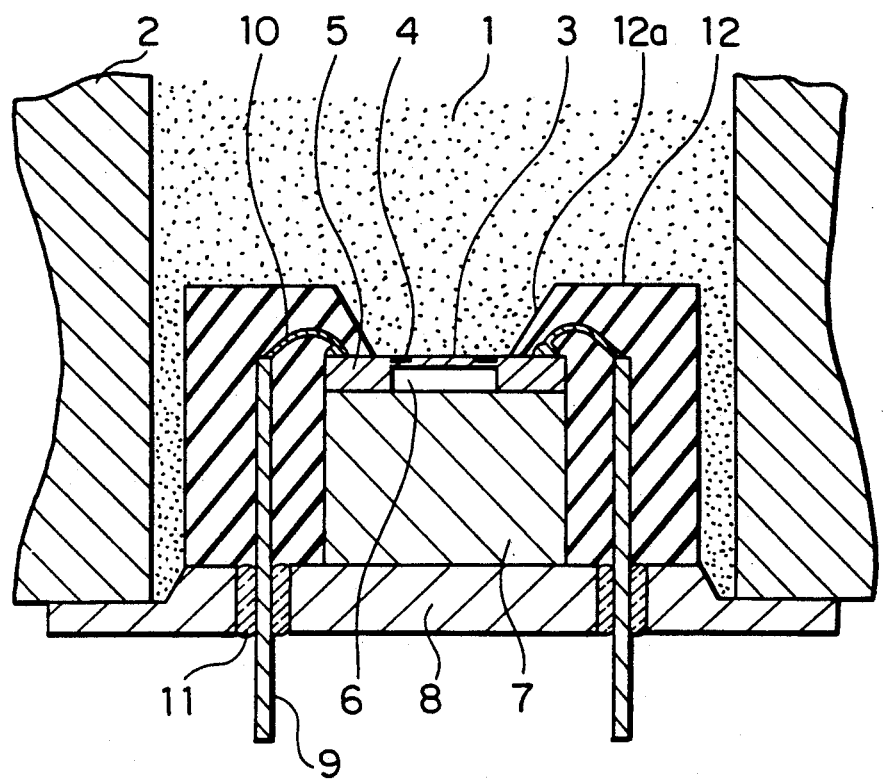
FIG. 1 is a cross sectional view which illustrates an embodiment of a semiconductor pressure-detecting apparatus according to the present invention.
Figure 3:
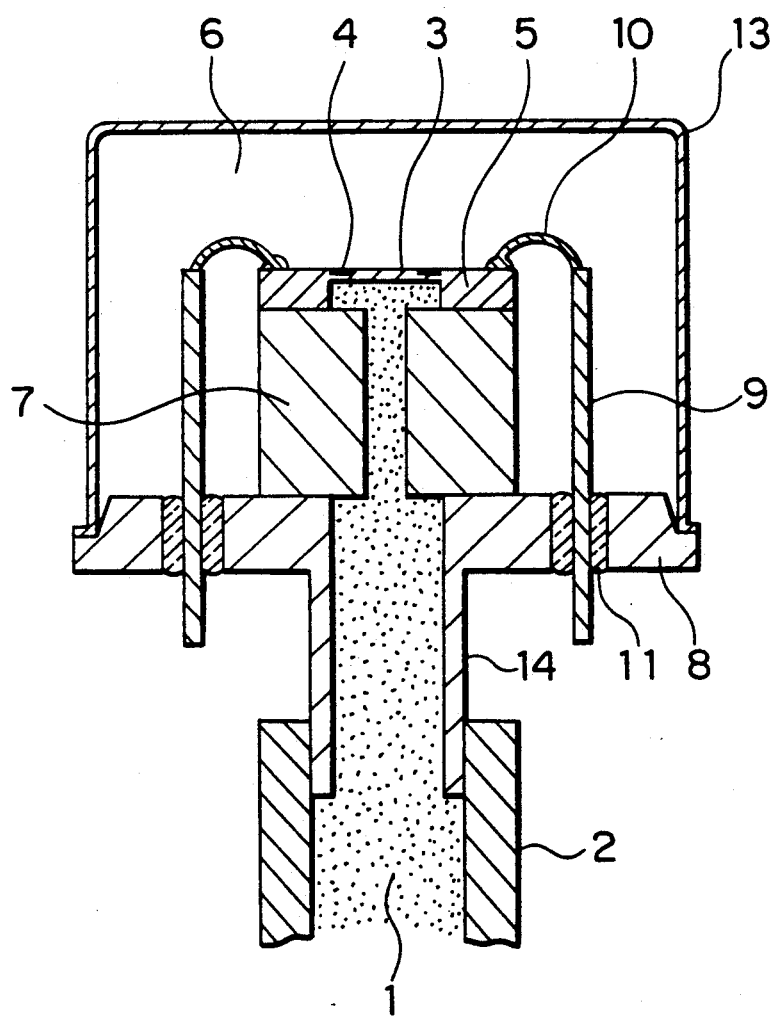
FIG. 3 is a cross sectional view which illustrates a conventional semiconductor pressure-detecting apparatus.

FIG. 1 is a cross sectional view which illustrates an embodiment of a semiconductor pressure-detecting apparatus according to the present invention, for example, a pressure sensor. The same reference numerals as those shown in FIG. 3 represent the same or equivalent elements of the above-described conventional semiconductor pressure-detecting apparatus. A semiconductor chip 5 is placed on a frame 7, the frame 7 being supported by a stem 8. A wire 10 electrically connected to the semiconductor chip 5 is connected to a lead 9, the lead 9 being secured to the stem 8 by glass 11. A molded portion 12 is disposed on the stem 8 in such a manner that the above-described semiconductor chip 5, the frame 7, the lead 9 and the wire 10 are covered by the molded portion 12, and the diaphragm 3 is exposed to the medium 1, the pressure of which is to be measured. The molded portion 12 is provided for the purpose of mechanically protecting the semiconductor chip 5, the lead 9, and the wire 10, the molded portion 12 being made of epoxy resin or the like.

Since the above-described semiconductor pressure-detecting apparatus is arranged in such a manner that the diaphragm 3 is exposed in an opening portion 12a of the molded portion 12, the medium 1 easily contacts the diaphragm 3. Furthermore, if the stem 8 is welded to the case 2 of equipment (omitted from illustration) containing the medium the pressure of which must be measured, the pressure of the medium 1 can be measured even if the pressure is high, for example, 200 to 300 atmospheres. That is, the molded portion 12 cannot be deformed and/or broken even if the medium 1 to be measured has a high pressure. In consequence, the wire 10 and the like cannot be broken.

Furthermore, since no pipe is used and the lead 9 and the medium 1 are therefore disposed on opposite sides of the stem 8, the lead 9 can easily be connected as desired. As a result, the size of the semiconductor pressure-detecting apparatus can be reduced.

Figure 2:
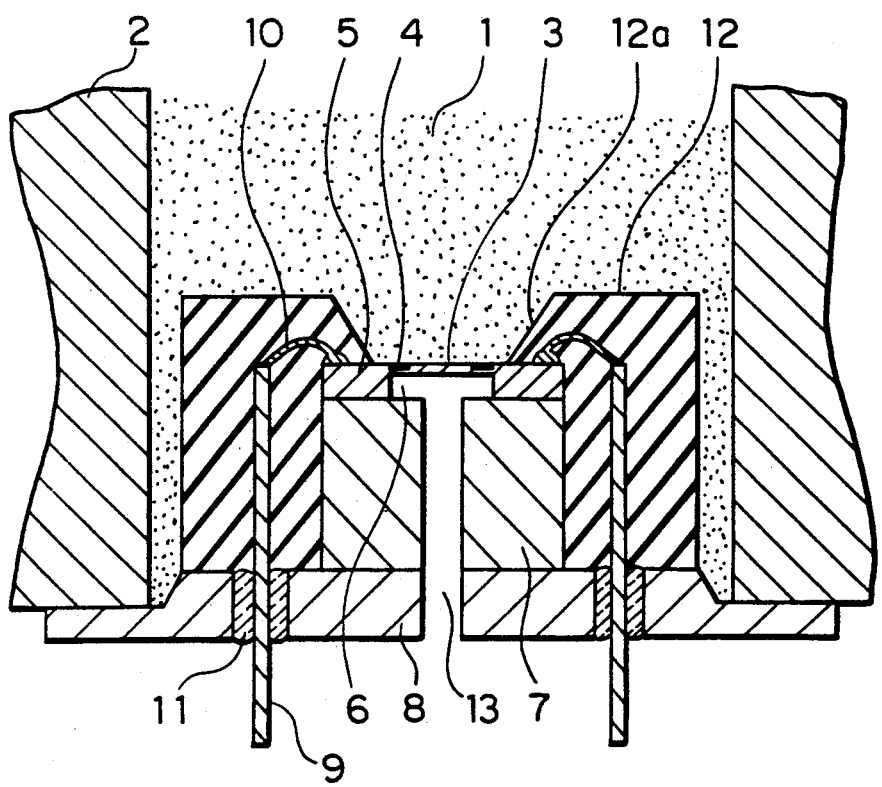
FIG. 2 is a cross sectional view which illustrates another embodiment of the semiconductor pressure-detecting apparatus according to the present invention.

Although the reference pressure chamber 6 is employed in the structure according to the above-described embodiment, another structure may be employed so as to obtain a similar effect, the structure being arranged in such a manner that a through hole 13 is, as shown in FIG. 2, formed in the frame 7 and the stem 8 so as to utilize atmospheric pressure as the reference pressure. Although the semiconductor chip 5 which uses the strain gauge 4 is described, another structure may be employed so as to obtain a similar effect, the structure being arranged in such a manner that an electrode is provided for each of the diaphragm 3 and the frame 7 so as to detect a change in the electrostatic capacity between the above-described electrodes.

What is claimed is:

1. A semiconductor pressure-detecting apparatus comprising:
    a semiconductor chip including a diaphragm for responding to a stress applied by a medium under pressure and a strain gauge for converting the stress into an electrical signal;
    a frame supporting said semiconductor chip;
    a stem supporting said frame;
    a wire connected to said semiconductor chip;
    a lead connected to said wire and penetrating said stem; and
    a resin disposed on a first side of said stem encapsulating said wire, said lead on the first side of said stem, said frame, and part of said semiconductor chip, said resin including an opening through which said diaphragm is exposed for directly contacting the medium, the pressure of which is to be detected from the stress applied to said diaphragm.

2. The semiconductor pressure-detecting apparatus of claim 1 including a case for containing the medium and coupled to said stem.

3. The semiconductor pressure-detecting apparatus of claim 1 wherein said frame and said stem includes a through hole extending to said diaphragm.

4. The semiconductor pressure-detecting apparatus of claim 1 wherein said resin is an epoxy resin.

5. The semiconductor pressure-detecting apparatus of claim 1 including a reference pressure chamber defined by and disposed between said semiconductor chip and said frame.

* * * * *